(12) United States Patent
Okura et al.

(10) Patent No.: US 10,584,414 B2
(45) Date of Patent: Mar. 10, 2020

(54) SUBSTRATE PROCESSING METHOD THAT INCLUDES STEP OF INTRODUCING BALLAST GAS TO EXHAUST LINE WHILE SUPPLYING PROCESSING GAS

(71) Applicant: TOKYO ELECTRON LIMITED, Tokyo (JP)

(72) Inventors: Shigeyuki Okura, Yamanashi (JP); Yuki Keimoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 3 days.

(21) Appl. No.: 15/921,506

(22) Filed: Mar. 14, 2018

(65) Prior Publication Data

US 2018/0265974 A1    Sep. 20, 2018

(30) Foreign Application Priority Data

Mar. 15, 2017    (JP) ................. 2017-049782

(51) Int. Cl.
| | |
|---|---|
| *H01L 21/285* | (2006.01) |
| *C23C 16/455* | (2006.01) |
| *C23C 16/44* | (2006.01) |
| *C23C 16/34* | (2006.01) |

(Continued)

(52) U.S. Cl.
CPC ........ *C23C 16/45527* (2013.01); *C23C 16/34* (2013.01); *C23C 16/4412* (2013.01); *H01L 21/28556* (2013.01); *H01L 21/28562* (2013.01); *H01L 21/28568* (2013.01); *H01L 21/32051* (2013.01); *H01L 21/76841* (2013.01)

(58) Field of Classification Search
CPC .......... H01L 21/0228; H01L 21/02697; H01L 21/28556; H01L 21/28562; H01L 21/28568; H01L 21/32051; H01L 21/76841; C23C 16/06; C23C 16/34; C23C 16/4412; C23C 16/45527; C23C 16/45534; C23C 16/45544; C23C 16/45548
See application file for complete search history.

(56) References Cited

U.S. PATENT DOCUMENTS

| | | | | |
|---|---|---|---|---|
| 7,559,992 | B2* | 7/2009 | Suzuki | .............. H01L 21/67017 118/715 |
| 2004/0118342 | A1* | 6/2004 | Cheng | ................. C23C 16/4412 118/715 |

(Continued)

FOREIGN PATENT DOCUMENTS

| | | |
|---|---|---|
| JP | 2014-198872 | 10/2014 |
| JP | 2016-23324 | 2/2016 |

(Continued)

*Primary Examiner* — Stephen W Smoot
(74) *Attorney, Agent, or Firm* — Fenwick & West LLP (57) ABSTRACT

In a substrate processing method for processing a substrate by alternately performing a processing gas supply step of supplying a processing gas for processing the substrate into a processing chamber which accommodates the substrate and to which a gas exhaust line is connected and a replacement gas supply step of supplying a replacement gas for replacing an atmosphere in the processing chamber into the processing chamber multiple times, a ballast gas is introduced into the gas exhaust line when the processing gas supply step is performed.

3 Claims, 10 Drawing Sheets

(51) Int. Cl.
*H01L 21/3205* (2006.01)
*H01L 21/768* (2006.01)

(56) References Cited

U.S. PATENT DOCUMENTS

| | | | | |
|---|---|---|---|---|
| 2004/0255854 | A1* | 12/2004 | Sakai | C23C 16/4405 118/715 |
| 2005/0000426 | A1* | 1/2005 | Im | C23C 16/40 118/715 |
| 2005/0120955 | A1* | 6/2005 | Yamasaki | C23C 16/16 118/715 |
| 2005/0221004 | A1* | 10/2005 | Kilpela | C23C 16/45525 427/248.1 |
| 2006/0062916 | A1* | 3/2006 | Won | C23C 16/45544 427/248.1 |
| 2006/0185593 | A1* | 8/2006 | Choi | C23C 16/14 118/715 |
| 2014/0295083 | A1 | 10/2014 | Nasu et al. | |
| 2015/0152557 | A1* | 6/2015 | Okura | C23C 16/4481 427/8 |
| 2017/0183773 | A1 | 6/2017 | Okura | |

FOREIGN PATENT DOCUMENTS

| KR | 10-2006-0072058 A | 6/2006 |
|---|---|---|
| KR | 10-2017-0019419 A | 2/2017 |

\* cited by examiner

SUBSTRATE PROCESSING METHOD THAT INCLUDES STEP OF INTRODUCING BALLAST GAS TO EXHAUST LINE WHILE SUPPLYING PROCESSING GAS

CROSS-REFERENCE TO RELATED APPLICATIONS

This application claims priority to Japanese Patent Application No. 2017-049782 filed on Mar. 15, 2017, the entire contents of which are incorporated herein by reference.

FIELD OF THE INVENTION

The present disclosure relates to a substrate processing apparatus and a substrate processing method for processing a substrate by alternately supplying a processing gas for processing a substrate and a replacement gas for replacing an atmosphere into a processing chamber where a substrate is accommodated.

BACKGROUND OF THE INVENTION

For example, in a manufacturing process of a semiconductor device or the like, various processes such as an etching process, a film forming process and the like are performed on a semiconductor wafer as a substrate (hereinafter, simply referred to as a "wafer"). As a technique for forming a film on a wafer, a so-called ALD (Atomic Layer Deposition) process may be used. In the ALD process, a film is formed by alternately supplying a source gas to be adsorbed on the surface of the wafer and a reactant gas (also referred to as a reducing gas) reacting with the source gas into a processing chamber in a vacuum atmosphere multiple times and depositing an atomic layer of a reaction product on the surface of the wafer. The source gas and the reactant gas are supplied at different timings to prevent particles from being generated due to gas phase reaction between the source gas and the reactant gas in a region other than the surface of the wafer in the processing chamber. An inert gas is supplied between the supply of the source gas and the supply of the reactant gas. Accordingly, the inside of the processing chamber is purged and an atmosphere in the processing chamber is replaced with an inert gas atmosphere.

Since it is necessary to perform a purge process as described above, the inert gas may be continuously supplied at a predetermined flow rate into the processing chamber during ALD, for example. The inert gas functions as a carrier gas of the source gas or the reactant gas while these gases are supplied and also functions as a purge gas while these gas are not supplied.

Japanese Patent Application Publication No. 2016-023324 discloses a film forming apparatus for performing ALD, in which a bypass channel is provided in a gas channel connecting a processing chamber and a supply source of $N_2$ gas serving as a carrier gas for a processing gas (raw material gas and reactant gas) and a purge gas. In this film forming apparatus, when the processing gas is supplied into the processing chamber, a valve in the bypass channel is closed. When the purge process is performed, the valve is opened to relatively increase the flow rate of $N_2$ gas supplied into the processing chamber.

Japanese Patent Application Publication. No. 2014-198872 discloses a film forming apparatus for performing ALD while increasing the amount of $N_2$ gas supplied into the processing chamber during the purge process, the film forming apparatus including a source gas channel connecting a source gas supply source and the processing chamber, a first $N_2$ gas channel branched from the source gas channel, a second $N_2$ gas channel for supplying $N_2$ gas as a purge gas into the processing chamber, the second $N_2$ gas channel being separately provided from the source gas channel and the first $N_2$ gas channel.

In order to miniaturize a wiring, it is required to perform ALD for ensuring formation of an extremely thin film with good continuity. As a method for ensuring the formation of an extremely thin film with good continuity, there may be considered a method of increasing time per a reactant gas supply step and a method of increasing a partial pressure in the processing chamber by increasing a flow rate of the reactant gas.

However, in the former method, the productivity decreases. If the partial pressure is increased by increasing the flow rate of the reactant gas as in the latter method, it is required to increase the purge time to prevent the generation of particles and, thus, the time required for the film forming process is increased. As in Japanese Patent Application Publication No. 2016-023324 and Japanese Patent Application Publication No. 2014-198872, it is possible to prevent the increase in the purge time by increasing the amount of $N_2$ gas supplied into the processing chamber during the purge process. However, if the flow rate of the reactant gas is high, the amount of reaction by-products deposited on an inner surface of the processing chamber and a gas exhaust system increases and a gas cost increases. Under these circumstances, there is a demand for a technique capable of forming an extremely thin film with good continuity even if the flow rate of the reactant gas is relatively small and also capable of quickly purging the inside of the processing chamber.

SUMMARY OF THE INVENTION

In view of the above, the present disclosure provides a technique for forming an extremely thin film with good continuity by increasing a partial pressure of a processing gas in a processing chamber without increasing a flow rate of the processing gas in processing a substrate by alternately supplying the processing gas and a replacement gas to the substrate in the processing chamber multiple times.

In accordance with an aspect, there is provided a substrate processing method for processing a substrate by alternately performing a processing gas supply step of supplying a processing gas for processing the substrate into a processing chamber which accommodates the substrate and to which a gas exhaust line is connected and a replacement gas supply step of supplying a replacement gas for replacing an atmosphere in the processing chamber into the processing chamber multiple times. The substrate processing method includes a ballast gas introducing step of introducing a ballast gas into the gas exhaust line when performing the processing gas supply step.

In accordance with another aspect, there is provided a substrate processing apparatus for processing a substrate by alternately supplying, into a processing chamber which accommodates the substrate and to which a gas exhaust line is connected, a processing gas for processing the substrate and a replacement gas for replacing an atmosphere in the processing chamber. The substrate processing apparatus includes a ballast gas introduction unit configured to introduce a ballast gas into the gas exhaust line when the processing gas is supplied.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Hereinafter, embodiments will be described with reference to the accompanying drawings. Like reference numerals will be given to like parts having substantially the same functional configurations in this specification and the drawings, and redundant description thereof will be omitted.

Figure 1:
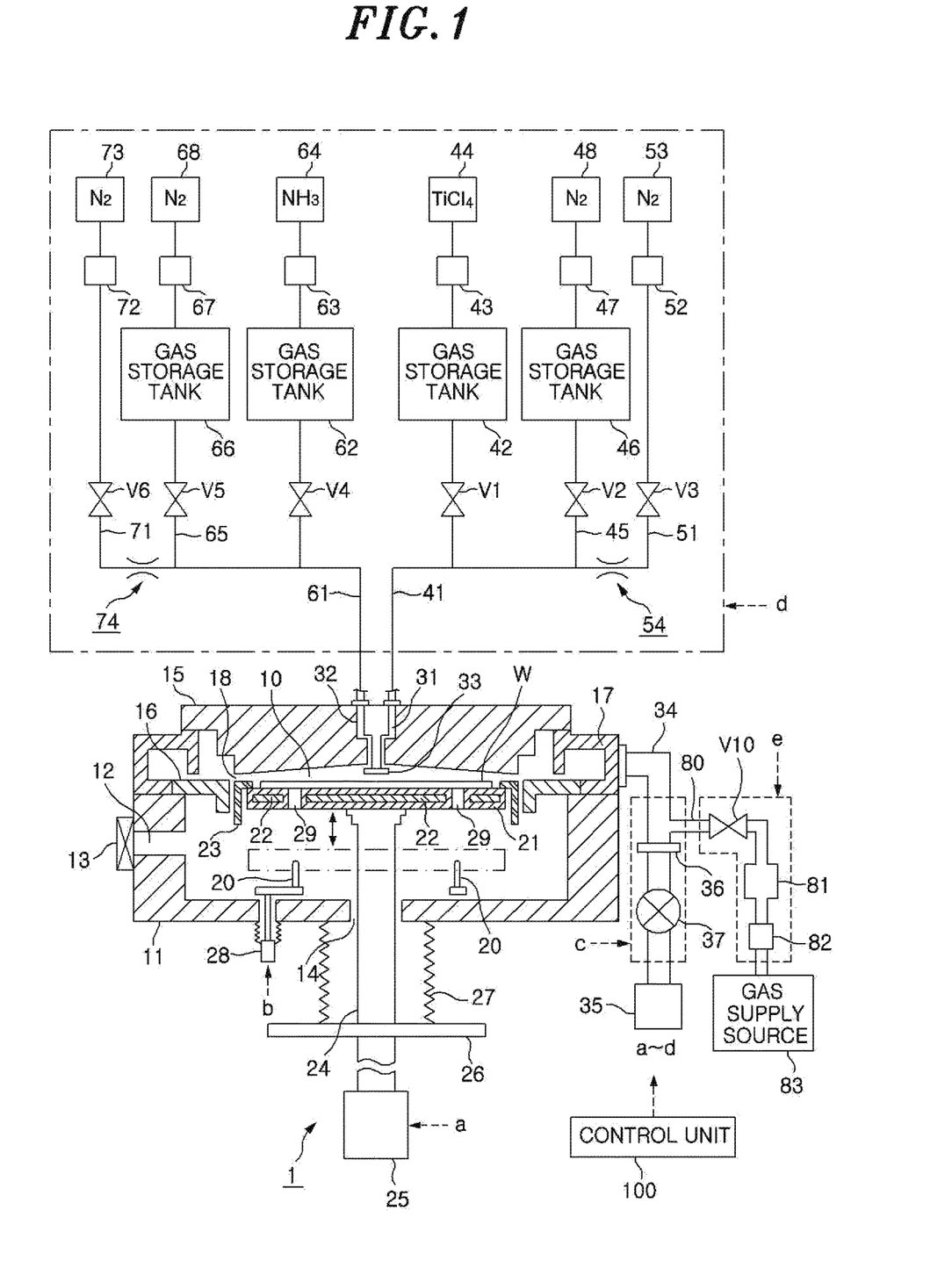
FIG. 1 is a longitudinal cross sectional side view of a film forming apparatus according to an embodiment.

FIG. 1 is a longitudinal cross sectional view schematically showing a film forming apparatus as a substrate processing apparatus according to an embodiment.

A film forming apparatus 1 shown in FIG. 1 performs a process of forming a TiN film on a wafer N as a substrate by the ALD method. More specifically, the film forming apparatus 1 performs a process of forming a TiN film by alternately supplying a processing gas for processing the wafer W and a replacement gas for replacing a processing gas atmosphere in a processing chamber 11 to be described later, i.e., a purge gas, into the processing chamber 11. More specifically, the film forming apparatus 1 performs a process of forming a TiN film by supplying $TiCl_4$ (titanium tetrachloride) gas that is a metal-containing gas serving as a processing gas, $N_2$ (nitrogen) gas that is an inert gas serving as a purge gas, $NH_3$ (ammonia) gas that is a reactant gas serving as a processing gas and $N_2$ gas serving as a purge gas into the processing chamber 11 in that order multiple times. During the process or forming a film by ALD, $N_2$ gas is continuously supplied, as a carrier gas for introducing $TiCl_4$ gas and $NH_3$ gas into the processing chamber 11, into the processing chamber 11.

The film forming apparatus 1 includes the processing chamber 11 having therein a circular space in which a vacuum atmosphere is generated. A wafer W is accommodated in the processing chamber 11. For example, irregularities are formed on the surface of the wafer W to form wirings.

Provided on a sidewall of the processing chamber 11 are an opening 12 as transfer port of the wafer W and a gate valve 13 for opening/closing the opening 12.

In the film forming apparatus 1, a mounting table 21 for mounting thereon the wafer W is provided in the processing chamber 11. A heater 22 is buried in the mounting table 21 and, thus, the wafer W mounted on the mounting table 21 can be heated to a predetermined temperature.

The film forming apparatus 1 further includes a cylindrical cover member 23 surrounding the mounting table 21 and a vertical support column 24 for supporting a lower portion of the mounting table 21. A lower end of the support column 24 extends through an opening 14 formed at a bottom portion of the processing chamber 11 to the outside of processing chamber 11 and is connected to an elevation mechanism 25. The support column 24 is provided with a flange 26. A bellows 27 is connected to the flange 26 and an edge of the opening 14 to ensure airtightness in the processing chamber 11

The elevation mechanism 25 can vertically move the mounting table 21 between a processing position of the wafer W in an upper side of the processing chamber 11 and a transfer position of the wafer W in a lower side of the processing chamber 11. At the transfer position, the wafer W is transferred between pins 20 for lifting up the wafer W through openings 29 formed at the mounting table 21 and a transport unit (not shown) inserted into the processing chamber 11 through the opening 12 by a pushing mechanism 28. The number of the pins 20 is, e.g., three (only two are shown in the drawing).

The ceiling surface of the processing chamber 11 is downwardly inclined from the center to the peripheral edgen. When the mounting table 21 is moved to the processing position of the wafer W, a conical processing space 10 surrounded by the surface of the mounting table 21, the surface of the cover member 23 and the ceiling surface of the processing chamber 11 is formed. Two gas supply lines 31 and 32 penetrating through a top plate 15 in a thickness direction thereof are formed at a central portion of the top plate 15 of the processing chamber 11 which forms the ceiling surface. A dispersion plate 33 for dispersing gases discharged from the gas supply lines 31 and 32 into the processing space 10 is provided below the gas supply lines 31 and 32 in a horizontal direction, for example.

In the processing chamber 11, an annular member 16 is provided such that an inner wall of the processing chamber 11 protrudes inwardly above the opening 12. The annular member 16 is provided to surround an outer side of the cover member 23 the mounting table 21 at the processing position. An annular gas exhaust duct 17 forming a part of the sidewall of the processing chamber 11 is provided in the processing chamber 11. An inner circumferential surface of the gas exhaust duct 17 is opened along a circumferential direction above the annular member 16. An atmosphere in the processing space 10 can be exhausted through a gap 18 formed between the cover member 23 and the top plate 15 of the processing chamber 11.

One end of a gas exhaust line 34 is connected to the gas exhaust duct 17 and the other end or the gas exhaust line 34 is connected to a vacuum exhaust pump 35. Between the gas exhaust duct 17 and the vacuum evacuation pump 35 in the gas exhaust line 34, an APC (Automatic Pressure controller) 36 having an opening degree variable valve for controlling a vacuum pressure in the processing space 10 by controlling an exhaust amount and a valve 37 are provided in that order from an upstream side.

Downstream ends of gas channels 41 and 61 are connected to the gas supply lines 31 and 32, respectively.

An upstream end of the gas channel 41 is connected to a $TiCl_4$ gas supply source 44 for supplying $TiCl_4$ gas that is a metal-containing gas via a valve V1, a gas storage tank 42, and a flow rate controller 43 in that order from the downstream side. The flow rate controller 43 includes a mass flow controller and controls a flow rate of $TiCl_4$ gas supplied from the $TiCl_4$ gas supply source 44 to the downstream side. Other flow rate controllers 47, 52, 63, 67, 72 and 82 to be described later are configured similarly to the flow rate controller 43 and controls flow rates of gases supplied to the downstream side of the channel.

The $TiCl_4$ gas supply source 44 has a tank for storing $TiCl_4$ in a liquid state. $TiCl_4$ in the tank is vaporized by heating the tank and the vaporized $TiCl_4$ is supplied to the gas channel 41. An appropriate flow rate controller is selected depending on a temperature of a gas whose flow rate will be controlled. The flow rate controller 43 for $TiCl_4$ is designed to control a flow rate of $TiCl_4$ gas having a relatively high temperature by heating.

The gas storage tank 42 temporarily stores $TiCl_4$ gas supplied from the gas supply source 44 before it is supplied into the processing chamber 11. After a pressure in the gas storage tank 42 is increased to a predetermined level, the stored $TiCl_4$ gas is supplied from the gas storage tank 42 into the processing chamber 11. The supply of $TiCl_4$ gas from the gas storage tank 42 into the processing chamber 11 is started/stopped by opening/closing the valve V1. By temporarily storing $TiCl_4$ gas in the gas storage tank 42, $TiCl_4$ gas can be stably supplied into the processing chamber 11 at a relatively high flow rate.

Similarly to the gas storage tank 42, the gas storage tanks 46, 62, 66 and 81 to be described later temporarily store gases supplied from gas supply sources on the upstream side of the gas channel and have a function of stabilizing flow rates of gases supplied into the processing chamber 11 or the gas exhaust line 34. By opening/closing valves V2, V4, V5 and V10 provided on the downstream side of the gas storage tanks 46, 62, 66 and 81, the supply of gases into the processing chamber 11 or the gas exhaust line 34 is started/stopped, respectively.

Returning to the description of the gas channel 41, a downstream end of a gas channel 45 is connected to a downstream side of the valve V1 in the gas channel 41. An upstream end of the gas channel 45 is connected to an $N_2$ gas supply source 48 via the valve V2, the gas storage tank 46, and the flow rate controller 47 in that order from the downstream side.

A downstream end of a gas channel 51 connected to a downstream side of the valve V2 in the gas channel 45. An upstream end of the gas channel 51 is connected to an $N_2$ gas supply source 53 via a valve V3 and the flow rate controller 52 in that order from the downstream side. An orifice 54 is formed on a downstream side of a valve V3 in the gas channel 51. In other words, a diameter of the gas channel 51 on the downstream side of the valve V3 is smaller than a diameter of the gas channel 51 on an upstream side of the valve V3 and diameters of the gas channels 41 and 45. Although gases are supplied to the gas channels 41 and 45 at relatively high flow rates from the gas storage tanks 42 and 46, the gases supplied to the gas channels 41 can be prevented from flowing backward to the gas channel 51 by the orifice 54.

$N_2$ gas supplied from the $N_2$ gas supply source 48 to the gas channel 45 is supplied into the processing chamber 11 to perform a purge process. On the other hand, $N_2$ gas supplied from the $N_2$ gas supply source 53 to the gas channel 51 serves as a carrier gas for $TiCl_4$ gas. Since the carrier gas is continuously supplied into the processing chamber 11 during the processing of the wafer W as described above, the carrier gas is also supplied into the processing chamber 11 during the purge process. Therefore, a time zone in which the carrier gas is supplied into the processing chamber 11 overlaps with a time zone in which $N_2$ gas is supplied from the gas supply source 48 into the processing chamber 11 to perform the purge process. Although the carrier gas is used for the purge process, the gas supplied from the $N_2$ gas supply source 48 to the gas channel 45 is referred to as a purge gas and the gas supplied from the $N_2$ gas supply source 53 to the gas channel 51 is referred to as a carrier, for convenience of description. The carrier gas also serves as a gas for preventing $TiCl_4$ gas from flowing backward to the gas channel 51.

Next, the gas channel 61 connected to the gas supply path 32 of the processing chamber 11 will be described. An upstream end of the gas channel 61 is connected to an $NH_3$ gas supply source 64 for supplying $NH_3$ gas as a processing gas via the valve V4, the gas storage tank 62, and the flow rate controller 63 in that order from the downstream side. The gas channel 61 is a reactant gas channel separately provided from the gas channel 41 that is a source gas channel.

A downstream end of a gas channel 65 is connected to a downstream side of the valve V4 in the gas channel 61. An upstream end of the gas channel 65 is connected to an $N_2$ gas supply source 68 via the valve V5, the gas storage tank 66, and the flow rate controller 67 in that order from the downstream side. A downstream end of a gas channel 71 is connected to a downstream side of the valve V5 in the gas channel 65. An upstream end of the gas channel 71 is connected to an $N_2$ gas supply source 73 via a valve V6 and the flow rate controller 72 in that order from the downstream side. An orifice 74 is formed on a downstream side of the valve V6 in the gas channel 71. In other words, a diameter of the gas channel 71 on the downstream side of the valve V6 is smaller than a diameter of the gas channel 71 on an upstream side of the valve V6 and diameters of the gas channels 61 and 65. Similarly to the orifice 54, the orifice 74 is formed to prevent the gases supplied to the gas channels 61 and 65 at relatively high flow rates from flowing backward to the gas channel 71.

$N_2$ gas supplied from the $N_2$ gas supply source 68 to the gas channel 65 is supplied into the processing chamber 11 in order to perform a purge process. $N_2$ gas supplied from the $N_2$ gas supply source 73 to the gas channel 71 serves as a carrier gas for $NH_3$ gas and is used for the purge process as in the case of the carrier gas for $TiCl_4$ gas. However, for convenience of description, the gas supplied from the $N_2$ gas supply source 68 to the gas channel 65 is referred to as a purge gas and the gas supplied from the $N_2$ gas supply source 73 to the gas channel 71 is referred to as a carrier gas. The carrier gas also serves as a gas for preventing $NH_3$ gas from flowing backward to the gas channel 71.

Since the gas channels are formed as described above, the gas channel 51 is provided with the valve V3 and the flow rate controller 52 as a carrier gas supply control device; the gas channel 45 is provided with the valve V2 and the flow rate controller 47 as a purge gas supply control device which is separately provided from the carrier gas supply control device; the gas channel 71 is provided with the valve V6 and the flow rate controller 72 as another carrier gas supply control device; and the gas channel 65 is provided with the valve V5 and the flow rate controller 67 as another purge gas supply control device which is separately provided from another carrier gas supply control device.

As described above, the purge gas is supplied into the processing chamber 11 from both of the gas channels 45 and 65. This is because it is required to purge not only TiCl$_4$ gas and NH$_3$ gas remaining in the processing chamber 11 but also TiCl$_4$ gas remaining on the downstream side of the valve V1 in the gas channel 41 and NH$_3$ gas remaining on the downstream side of the valve V4 in the gas channel 61. In other words, two channels for the purge gas are formed to more reliably purge TiCl$_4$ gas and NH$_3$ gas.

A downstream end of a gas channel 80 is connected to an upstream side of the APC 36 in the gas exhaust line 34. An upstream end of the gas channel 80 is connected to an N$_2$ gas supply source 83 for supplying N$_2$ gas that is an inert gas serving as a ballast gas via the valve V 10, the gas storage tank 81 and the flow rate controller 82 in that order from the downstream side. A vacuum pressure in the processing space 10 can be controlled by, e.g., the amount of the ballast gas supplied from the gas channel 80 into the gas exhaust line 34.

As for the valve V10, there is used a high-speed valve in which a time taken from an input of a control signal to open the valve V10 to the actual opening of the valve V10 is considerably short. The time from the input of the control signal to the actual opening of the valve 10 is, e.g., about 10 msec. The time required until the valve V10 is opened can be shortened by using the valve V10 configured as an air-operated valve and increasing strength of a spring of the air-operated valve.

The film forming apparatus 1 includes a control unit 100. The control unit 100 is, e.g., a computer, and has a program storage unit (not shown). The program storage unit stores therein a program for controlling various devices such as the heater 22, the valves V1 to V6, V10 and V37, the flow rate controllers 43, 47, 52, 63, 67, 72 and 82, the APC 36 and a program for operating the apparatus 1.

The above program is stored in a computer-readable storage medium such as a computer-readable hard disk (HD), a flexible disk (FD), a compact disk (CD), a magnet optical disk (MO), a memory card or the like and may be installed in the control unit 100 from the storage medium.

Next, the film forming process in the film forming apparatus 1 will be described with reference to FIGS. 2 to 5 showing the opened/closed states of the valves and the gas flow states in the gas channels. In FIGS. 2 to 5, the valves in the open state are shown in white; the valves in the closed state are shown in black; and the gas channels through which the gases flow at the downstream sides thereof are indicated by thick lines. The processing chamber 11 and the respective components in the processing chamber 11 which are illustrated in FIGS. 2 to 5 are simplified compared to those illustrated in FIG. 1. In the following description of the film forming process, the timing chart of FIG. 6 will be appropriately referred to. In this timing chart, time zones in which TiCl$_4$ gas, NH$_3$ gas, the carrier gas and the purge gas flow are indicated by rectangular regions with gray scales of different densities. Heights of the rectangular regions correspond to the amount of gases supplied into the processing chamber 11. As the height of the rectangular region is increased, the supply amount of gases is increased.

First, in a state where the valves V1 to V6 and V10 are closed, the wafer W is transferred to the processing chamber 11 by the transfer unit and mounted on the mounting table 21 at the transfer position. The transfer unit is retreated from the processing chamber 11 and, then, the gate valve 13 is closed. The wafer W is heated to, e.g., 460° C., by the heater 22 of the mounting table 21, and the mounting table 21 is raised to the processing position. Accordingly, the processing space 10 is generated. A pressure in the processing chamber 11 is controlled to a predetermined vacuum level by the APC 36 provided in the gas exhaust line 34. The valves V3 and V6 are opened, and a carrier gas (N$_2$ gas) is supplied at a flow rate of, e.g., 500 sccm, from each of the N$_2$ gas supply sources 53 and 73 to each of the gas channels 51 and 71. In other words, the carrier gas is supplied at a total flow rate of 1000 sccm into the processing chamber 11. On the other hand, in a state where the valves V1, V4, and V10 are closed, TiCl$_4$ gas, NH$_3$ gas and N$_2$ gas are supplied from the gas supply sources 44, 64 and 83 to the gas channels 41, 61 and 80, respectively, at respective timings. As a result, TiCl$_4$ gas, NH$_3$ gas and N$_2$ gas are stored in the gas storage tanks 42, 62, 81, respectively, and the pressures in the gas storage tanks 42, 62 and 81 are increased.

Figure 2:
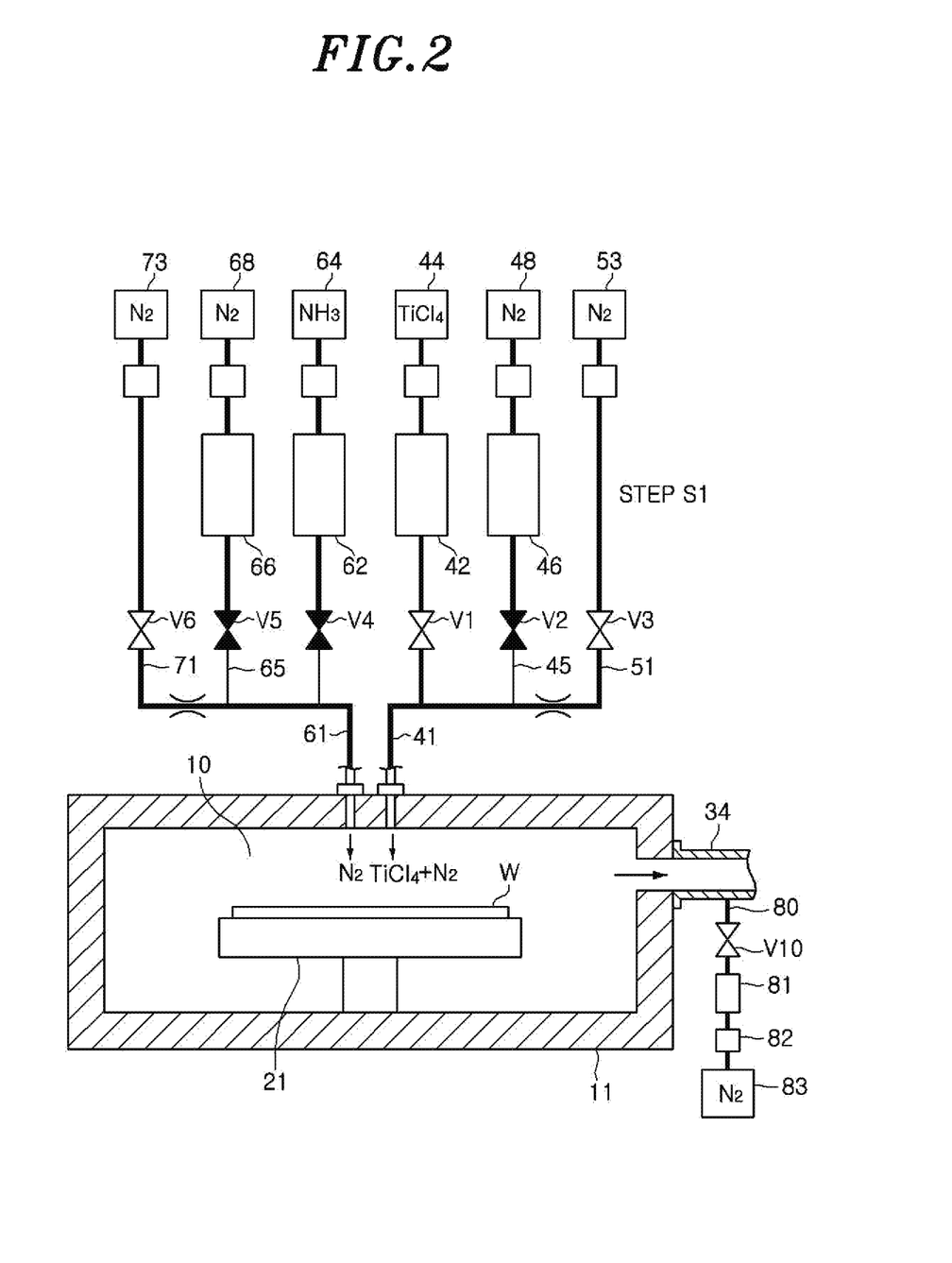
FIGS. 2 to 5 are schematic diagrams for explaining processes performed by the film forming apparatus shown in FIG. 1.

After a predetermined period of time elapses from the start of the supply of the carrier gas, the valves V1 and V10 are opened (time t1 in FIG. 6); and N$_2$ gas stored in the gas storage tank 81 is supplied into the gas exhaust line 34; and TiCl$_4$ gas stored in the gas storage tank 42 is supplied into the processing chamber 11 and adsorbed on the surface of the wafer W, as shown in FIG. 2. Since N$_2$ gas, i.e., the ballast gas, is introduced into the gas exhaust line 34 at the time of supplying TiCl$_4$ gas into the processing chamber 11, the amount of gas exhausted from the processing space 10 can be quickly decreased to a desired level. Therefore, even when the flow rate of TiCl$_4$ gas from the gas storage tank 42 is not high, a partial pressure of TiCl$_4$ gas in the processing chamber 11 can be quickly increased, compared to the case where the ballast gas is not introduced.

When TiCl$_4$ gas is supplied into the processing chamber 11, a purge gas (N$_2$ gas) is also supplied from the gas supply sources 48 and 68 to the gas channels 45 and 65, respectively, in a state where the valves V2 and V5 are closed. As a result, the purge gas is stored in the gas storage tanks 46 and 66, and the pressures in the gas storage tanks 46 and 66 are increased (Step S1).

Figure 3:
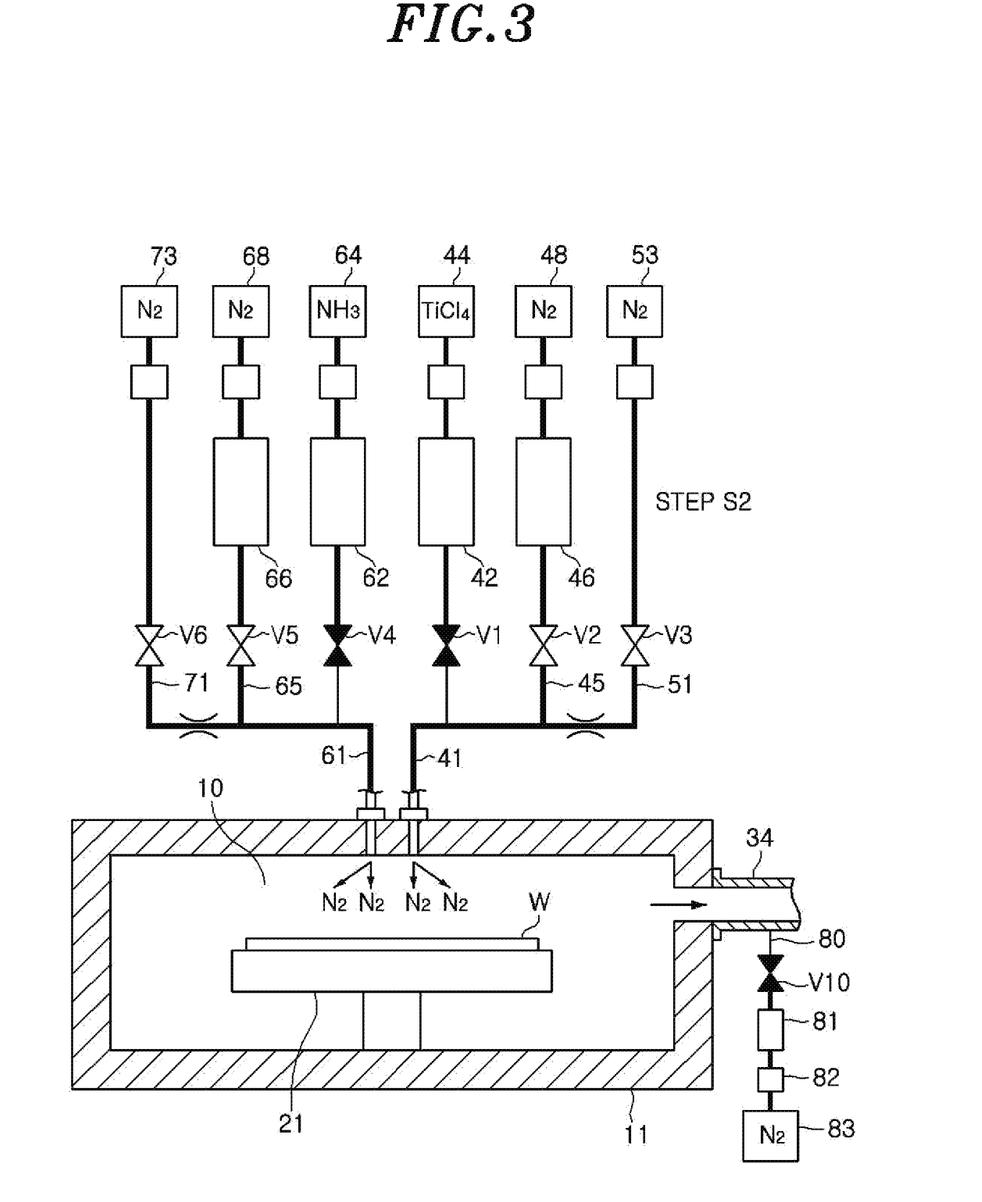

After 0.05 second, for example, elapses from the time t1, the valves V1 and V10 are closed and the valves V2 and V5 are opened (time t2 in FIG. 6); the supply of TiCl$_4$ gas into the processing chamber 11 and the supply of N$_2$ gas into the gas exhaust line are stopped; and the purge gas stored in the gas storage tanks 46 and 66 is supplied into the processing chamber 11, as shown in FIG. 3.

Since the supply of N$_2$ gas, i.e., the ballast gas, into the gas exhaust line 34 is stopped when the supply of TiCl$_4$ gas into the processing chamber 11 is stopped, the amount of gas exhausted from the processing space 10 can be quickly returned to a state before the supply of the ballast gas. Therefore, TiCl$_4$ gas remaining in the processing chamber 11 is quickly exhausted to the gas exhaust line 34, compared to the case where the amount of gas exhausted from the processing space 10 is controlled by the APC 36, and a TiCl$_4$ gas atmosphere in the processing chamber 11 is replaced with an N$_2$ gas atmosphere.

By supplying the purge gas from the gas storage tanks 46 and 66 where the pressures are increased as described above, the purge gas is supplied at a relatively high flow rate, e.g., 1500 sccm to 5000 sccm which is higher than the flow rate of the carrier gas. Therefore, TiCl$_4$ gas remaining in the processing chamber 11 is more quickly exhausted to the gas exhaust line 34, and a TiCl$_4$ gas atmosphere in the processing chamber 11 is replaced with an N$_2$ gas atmosphere.

By purging the processing chamber 11 while closing the valve V1, TiCl$_4$ gas supplied from the gas supply source 44 to the gas channel 41 is stored in the gas storage tank 42 and the pressure in the storage tank 42 is increased. Further, by closing the valve V10, N$_2$ gas supplied from the gas supply source 83 to the gas channel 80 is stored in the gas storage tank 81 and the pressure in the gas storage tank 81 is increased (step S2).

Figure 4:
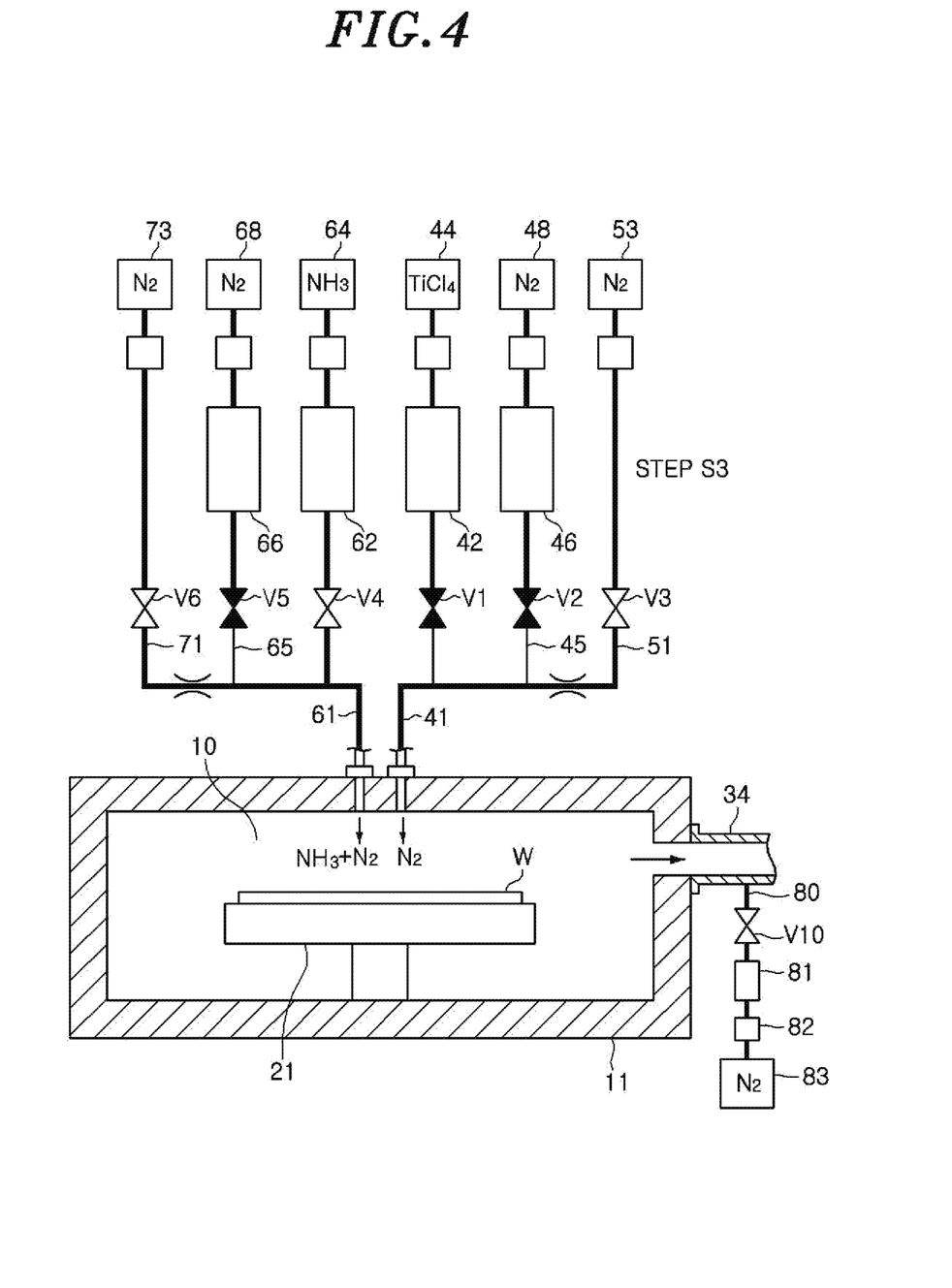

After 0.2 second, for example, elapses from the time t2, the valves V2 and V5 are closed and the valves V4 and V10 are opened (time t3 in FIG. 6), as shown in FIG. 4. Accordingly, the supply of the purge gas into the processing chamber 11 is stopped; $N_2$ gas stored in the gas storage tank 81 is supplied to the exhaust line 34; $NH_3$ gas stored in the gas storage tank 62 is suppled into the processing chamber 11 and reacts with $TiCl_4$ gas adsorbed on the surface of the wafer W. As a result, an atomic layer of TiN that is a reaction product is formed. Since $N_2$ gas serving as a ballast gas is introduced into the gas exhaust line 34 at the time of supplying $NH_3$ gas into the processing chamber 11, the amount of gas exhausted from the processing space 10 can be quickly decreased to a desired level. Therefore, even if the flow rate of $NH_3$ gas from the gas storage tank 62 is not high, a partial pressure of $NH_3$ gas in the processing chamber 11 can be quickly increased, compared to the case where the ballast gas is not introduced.

On the other hand, by closing the valves V2 and V5, the purge gas supplied from the gas supply sources 48 and 68 to the gas channels 45 and 65 is stored in the gas storage tanks 46 and 66, respectively, and the pressures in the gas storage tanks 46 and 66 are increased (step S3).

Figure 5:
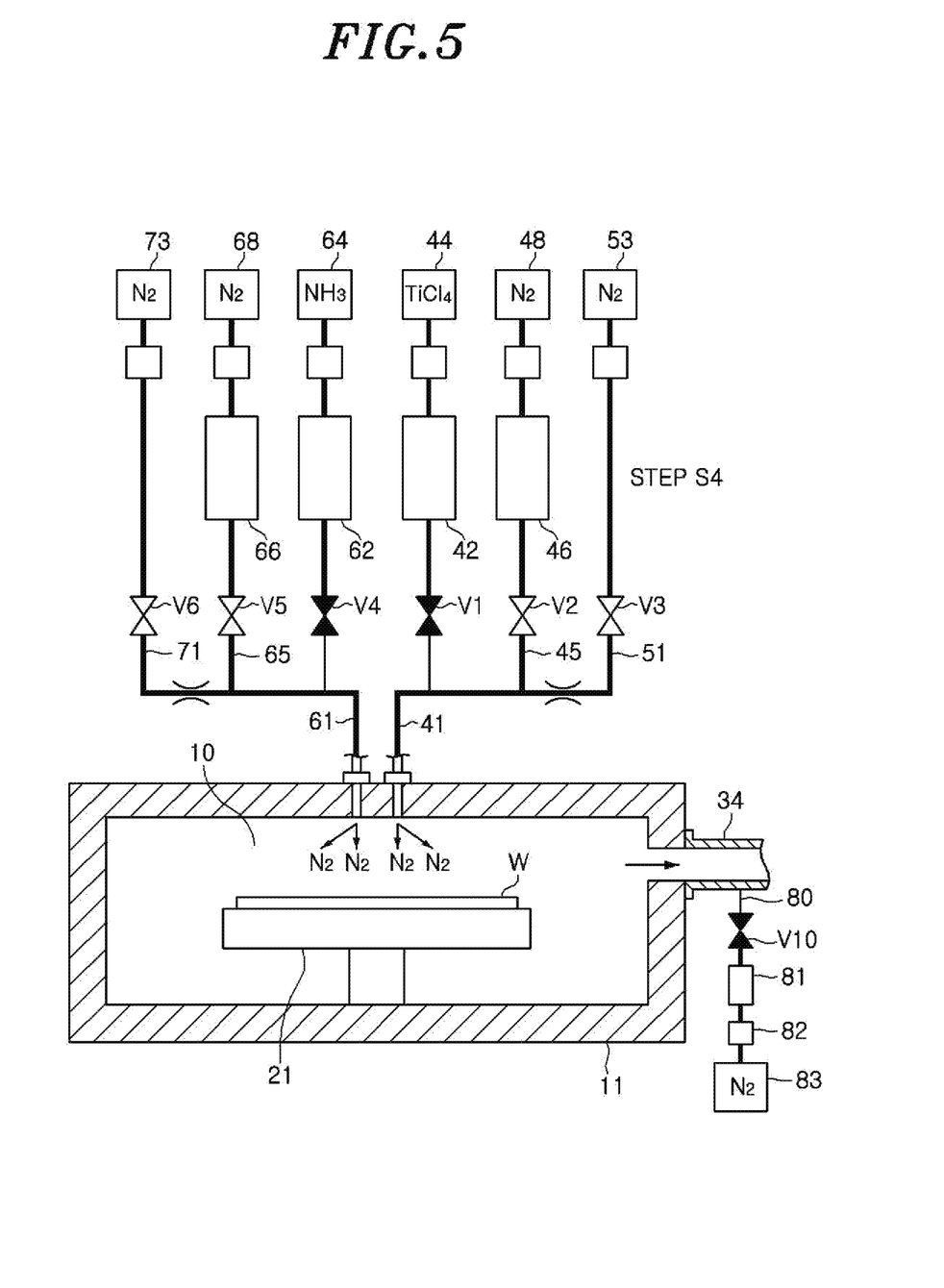
Figure 6:
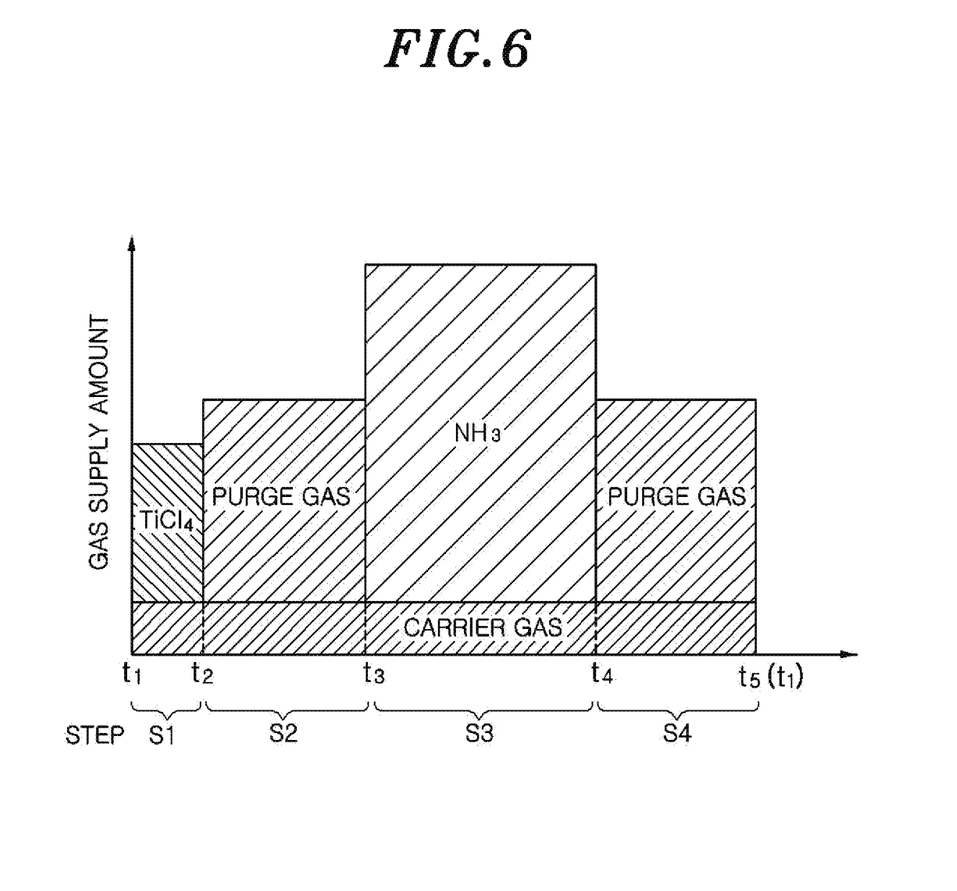
FIG. 6 is a timing chart showing changes in the amount of gases supplied for the processes performed by the film forming apparatus of FIG. 1.

After 0.3 second, for example, elapses from the time t3, the valves VA and V10 are closed and the valves V2 and V5 are opened (time t4 in FIG. 6); the supply of $NH_3$ gas into the processing chamber 11 and the supply of $N_2$ gas into the gas exhaust line 34 are stopped; and the purge gas stored in the gas storage tanks 46 and 66 is supplied into the processing chamber 11, as shown in FIG. 5.

Since the supply of $N_2$ gas, i.e., the ballast gas, into the gas exhaust line 34 is stopped when the supply of $NH_3$ gas into the processing chamber 11 is stopped, the amount of gas exhausted from the processing space 10 can be quickly returned to a state before the supply of the ballast gas. Therefore, $NH_3$ gas remaining in the processing chamber 11 is quickly exhausted to the gas exhaust line 34, compared to the case where the amount of gas exhausted from the processing space 10 is controlled by the APC 36, and an $NH_3$ gas atmosphere in the processing chamber 11 is replaced with an $N_2$ gas atmosphere.

By supplying the purge gas from the gas storage tanks 46 and 66 where the pressures are increased as described above, the purge gas is supplied at a flow rate of, e.g., 1500 sccm to 5000 sccm, into the processing chamber 11. Therefore, $NH_3$ gas remaining in the processing chamber 11 is more quickly exhausted to the gas exhaust line 34, and an $NH_3$ gas atmosphere in the processing chamber 11 is replaced with an $N_2$ gas atmosphere. By purging the processing chamber 11 while closing the valve V4, $NH_3$ gas supplied from the gas supply source 64 to the gas channel 41 is stored in the gas storage tank 62, and the pressure in the storage tank 62 is increased. By closing the valve V10, $N_2$ gas supplied from the gas supply source 83 to the gas channel 80 is stored in the gas storage tank 81, and the pressure in the gas storage tank 81 is increased (step S4).

By performing the purge process while closing the valve V1, $TiCl_4$ gas supplied from the gas supply source 44 to the gas channel 41 stored in the gas storage tank 42, and the pressure in the gas storage tank 42 is increased. By closing the valve V10, $N_2$ gas supplied from the gas supply source 83 to the gas channel 80 is stored in the gas storage tank 81, and the pressure in the gas storage tank 81 is increased.

After 0.3 second, for example, elapses from the time t4, the valves V2 and V5 are closed and the valves V1 and V10 are opened (time t5 in FIG. 6); the supply of the purge gas into the processing chamber 11 is stopped; $N_2$ gas stored in the tank 81 is supplied into the gas exhaust line 34; and $TiCl_4$ gas stored in the gas storage tank 42 is supplied into the processing chamber 11. In other words, the step S1 is performed again. Therefore, the time t5 at which the purge process is completed corresponds to the time t1 at which the supply of $TiCl_4$ gas is started. After the step S1 is performed, the steps S2 to S4 are performed. Then, the steps S1 to S4 are performed again. In other words, by repeatedly performing a cycle of the steps S1 to S4, an atomic layer of TiN is deposited on the surface of the wafer W and a TiN film is formed. After the cycle of the steps S1 to S4 is repeated a predetermined number of times, the wafer W is unloaded from the processing chamber 11 in the reverse order of loading the wafer W into the processing chamber 11.

In the film forming apparatus 1, the gas channel 80 for the ballast gas is connected to the gas exhaust line 34. When $NH_3$ gas is supplied, the ballast gas is supplied from the gas channel 80 into the gas exhaust line 34. Therefore, the amount of gas exhausted from the processing space 10 can be quickly decreased. Accordingly, even if the flow rate of $NH_3$ gas from the gas storage tank 62 is not high, a partial pressure of $NH_3$ gas in the processing chamber 11 can be quickly increased, and an extremely thin film with good continuity can be formed.

Since the supply of the ballast gas into the gas exhaust line 34 is stopped when the supply of $NH_3$ gas into the processing chamber 11 is stopped, the amount of gas exhausted from the processing space 10 can be quickly returned to a state before the supply of the ballast gas. Accordingly, the $NH_3$ gas atmosphere in the processing chamber 11 can be quickly replaced with an $N_2$ gas atmosphere.

In the film forming apparatus 1, the ballast gas is supplied from the gas channel 80 into the gas exhaust line 34 even when $TiCl_4$ gas is supplied, as described above. Therefore, the amount of gas exhausted from the processing space 10 in the processing chamber 11 can be quickly decreased even when $TiCl_4$ gas is supplied. Accordingly, even if the flow rate of $TiCl_4$ gas from the gas storage tank 42 is not high, a partial pressure of $TiCl_4$ gas in the processing chamber 11 can be quickly increased, and an extremely thin film with good continuity can be formed.

Since the supply of the ballast gas into the gas exhaust line 34 is stopped when the supply of $TiCl_4$ gas into the processing chamber 11 is stopped, the amount of gas exhausted from the processing space 10 can be quickly changed to the state before the supply of the ballast gas. Therefore, an $TiCl_4$ gas atmosphere in the processing chamber 11 can be quickly replaced with an $N_2$ gas atmosphere.

In the film forming apparatus 1, it is possible to suppress the increase in the flow rates of $TiCl_4$ gas and $NH_3$ gas required for generating an extremely thin film with good continuity and, thus, the adhesion of $TiCl_4$ gas and $NH_3$ gas to the gas channels 41 and 61 can be suppressed and the frequency of maintenance can be reduced. In other words, a TiN film that is an extremely thin film with good continuity can be formed by increasing the flow rates of $TiCl_4$ gas and $NH_3$ gas to be supplied into the processing chamber 11 within a range in which the adhesion of $TiCl_4$ gas and $NH_3$ gas to the gas channels 41 and 61 can be sufficiently suppressed and increasing the partial pressures of $TiCl_4$ gas and $NH_3$ gas in the processing chamber 11.

In the film forming apparatus 1, the gas channels 45 and 65 for supplying a purge gas into the processing chamber 11 are respectively provided with the flow rate controllers 47 and 67 and the valves V2 and V5 which are different from the flow rate controllers 52 and 72 and the valves V3 and V6 provided in the gas channels 51 and 71 for supplying a carrier gas of $TiCl_4$ gas and $NH_3$ gas. The gas channels 45 and 65 for the purge gas are respectively provided with the gas storage tanks 46 and 66. After the pressures in the gas storage tanks 46 and 66, the purge gas stored therein is supplied into the processing chamber 11 by opening/closing the valves V2 and V5. Therefore, the purge gas can be supplied into the processing chamber 11 at a relatively high flow rate, and the atmosphere in the processing chamber 11 can be replaced more quickly. Accordingly, the throughput can be improved. Since the atmosphere in the processing chamber 11 is replaced with the purge gas whose flow rate is controlled separately from the carrier gas, it is possible to further suppress the increase in the flow rate of the carrier gas. Since the increase in the flow rates of $TiCl_4$ gas and $NH_3$ gas required for forming an extremely thin film with good continuity can be further suppressed, the adhesion of $TiCl_4$ gas and $NH_3$ gas to the gas channels 41 and 61 can be suppressed and the frequency of maintenance can be reduced.

Although the purge gas is supplied at a relatively high flow rate into the processing chamber 11 in the above film forming process, $TiCl_4$ gas and $NH_3$ gas respectively stored in the gas storage tanks 42 and 62 are also supplied at relatively high flow rates into the processing chamber 11, as in the case of the purge gas. Therefore, the time zone in which $TiCl_4$ gas and $NH_3$ gas are supplied can be reduced and, thus, the throughput can be more reliably improved.

The gas channels 51 and 71 for the purge gas are not necessarily connected to the gas channels 41 and 61 for supplying $TiCl_4$ gas and $NH_3$ gas, respectively. For example, the gas channels 51 and 71 may be connected to a gas supply line for supplying a gas into the processing chamber 11 which is provided, in addition to the gas supply lines 31 and 32, at the ceiling plate 15 of the processing chamber 11. In that case, it is not necessary to provide two gas channels 51 and 71, and one of the gas channels 51 and 71 may be provided. However, in order to purge the gas channels 41 and 61 as described above, it is preferable to connect the gas channels 51 and 71 for the purge gas to the two gas channels 41 and 61, respectively.

In the above description, the film forming apparatus 1 supplies the ballast gas from the gas channel 80 into the gas exhaust line 34 at the time of supplying $TiCl_4$ gas and at the time of supplying $NH_3$ gas. Or, the film forming apparatus 1 may supply the ballast gas from the gas channel into the gas exhaust line 34 at the time of supplying $TiCl_4$ gas or at the time of supplying $NH_3$ gas. Particularly, when the supply amount of the ballast gas is common at the time of supplying $TiCl_4$ gas and at the time of supplying $NH_3$ gas and it is difficult to set the partial pressure of $TiCl_4$ gas or the like to a desired level at a desired speed, the ballast gas may be supplied at the time of supplying either of $TiCl_4$ gas or $NH_3$ gas. When it is necessary to vary the supply amount of the ballast gas at the time of supplying $TiCl_4$ gas and at the time of supplying $NH_3$ gas, a plurality of ballast gas supply lines may be provided. When a plurality of ballast gas supply lines is provided, the manufacturing cost or the size of the film formation apparatus 1 is increased.

When the ballast gas is supplied from the gas channel 80 into the gas exhaust line 34 at the time of supplying either of $TiCl_4$ gas or $NH_3$ gas as described above, it is preferable to supply the ballast gas only at the time of supplying $NH_3$ gas. This is because, as will be described later, it is possible to produce an extremely thin film with good continuity when $NH_3$ gas is supplied.

Although the ballast gas is introduced to the upstream side of the APC 36 in the gas exhaust line 34 in the above description, the ballast gas may be introduced to the downstream side of the APC 36 in the gas exhaust line 34. However, as will be described later, an extremely thin film with good continuity can be formed by introducing the ballast gas to the upstream side of the APC 36. Since the opening degree of the APC 36 for obtaining the same exhaust amount varies temporally due to the adhesion of reaction products to the gas exhaust line 34 or the like, when the ballast gas is introduced to the downstream side of the APC 36, it is required to change the supply amount of the ballast gas depending on the opening degree. However, when the ballast gas is introduced to the upstream side of the APC 36, the supply amount of the ballast gas can be constant regardless of the opening degree.

The timing of starting introduction of the ballast gas into the gas exhaust line 34 and the timing of supplying $TiCl_4$ gas or $NH_3$ gas may be the same or different. Specifically, the timing of opening the valve V10 for the ballast gas and the timing of opening the valves V1 and V4 for $TiCl_4$ gas or $NH_3$ gas may be the same or different. Particularly, the timing of opening the valve V10 may be later than the timing of opening the valves V1 and V4. This is because a distance from the valve V1 to the gas exhaust line 34 is longer than a distance from the valve V10 to the gas exhaust line 34.

The carrier gas, the purge gas and the ballast gas may be supplied from the same gas supply source.

Evaluation Tests

Next, evaluation tests conducted in connection with the present disclosure will be described. In the following description, the flow rates of the gases are not the gas flow rates in the flow rate controllers 43, 47, 52, 63, 67, 72 and 82 but the gas flow rates in the processing chamber 11 or the gas exhaust line 34.

In the evaluation tests, the gases were supplied by using the film forming apparatus 1 based on the timing chart shown in FIGS. 7A and 7B or FIGS. 8A and 8B.

Figure 7A:
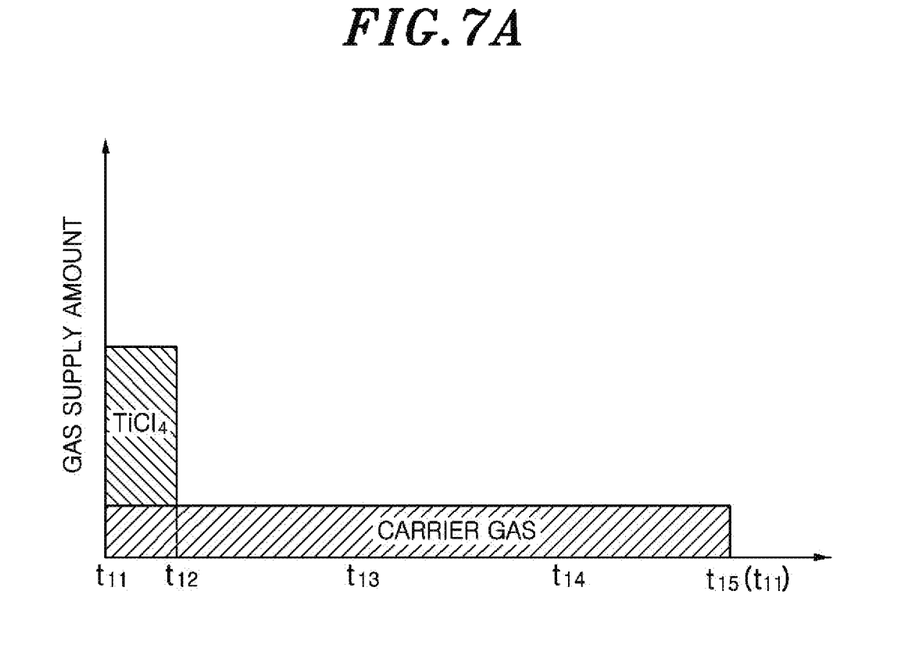
FIGS. 7A and 7B are timing charts showing changes in the amount of gases supplied in an evaluation test.
Figure 7B:
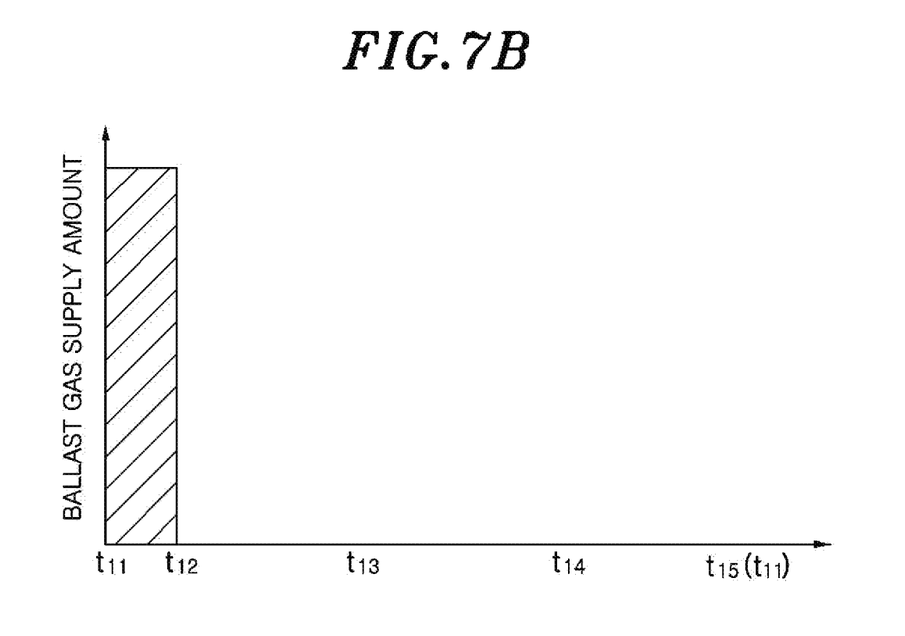

In the evaluation test A, $N_2$ gas as a carrier gas was continuously supplied at a flow rate of 1000 sccm, as shown in FIGS. 7A and 7B. Further, in the evaluation test A, a step of simultaneously supplying $TiCl_4$ gas at a flow rate of 150 sccm and the ballast gas at a flow rate of 10000 sccm for 0.05 second and a step of performing a purge process for 0.80 second by using $N_2$ gas also serving as the carrier gas were repeatedly performed in this order 300 times.

Figure 8A:
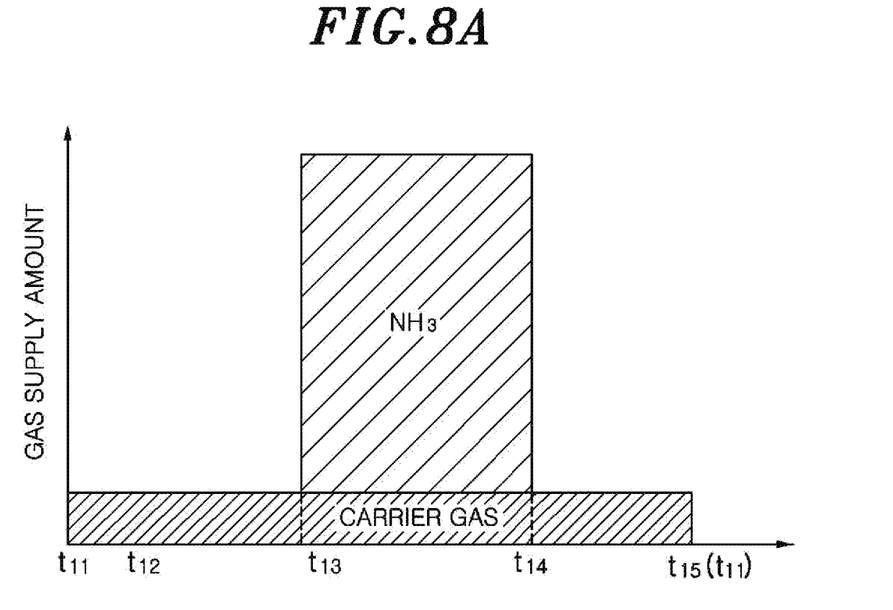
FIGS. 8A and 8B are timing charts showing changes in the amount of gases supplied in another evaluation test.
Figure 8B:
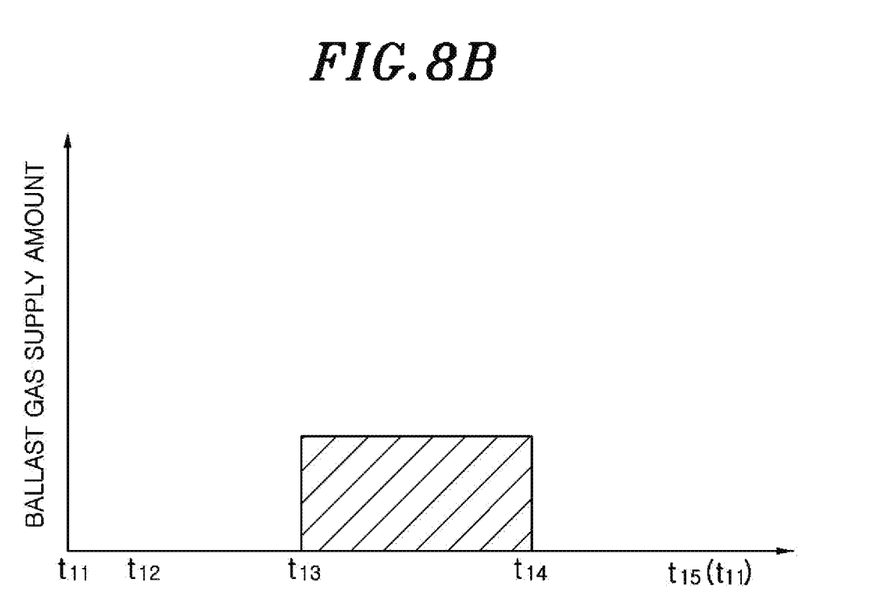

In the evaluation test B, $N_2$ gas as a carrier gas was supplied at a flow rate of 1000 sccm, as shown in FIGS. 8A and 8B. Further, in the evaluation test B, a step of simultaneously supplying $NH_3$ gas at a flow rate of 6000 sccm and the ballast gas at a flow rate of 10000 sccm for 0.30 second and a step of performing a purge process for 0.55 second by using $N_2$ gas also serving as the carrier gas were repeatedly performed in this order 300 times.

In a comparative test X, the film forming apparatus 1 was used and $N_2$ gas as a carrier gas was constantly supplied at a flow rate of 1000 sccm. Further, in the comparative test X, a step of supplying $TiCl_4$ gas at a flow rate of 150 sccm which is the same flow rate as that in the evaluation test A for 0.05 second without supplying the ballast gas, a step performing a purge process for 0.20 second by using $N_2$ gas also serving as the carrier gas, a step of supplying $NH_3$ gas at a flow rate of 6000 sccm which is the same flow rate as that in the evaluation test B for 0.30 second without supplying the ballast gas, and a step of performing a purge process for 0.3 second by using $N_2$ gas also serving as the carrier gas were repeatedly performed in that order 300 times.

Figure 9:
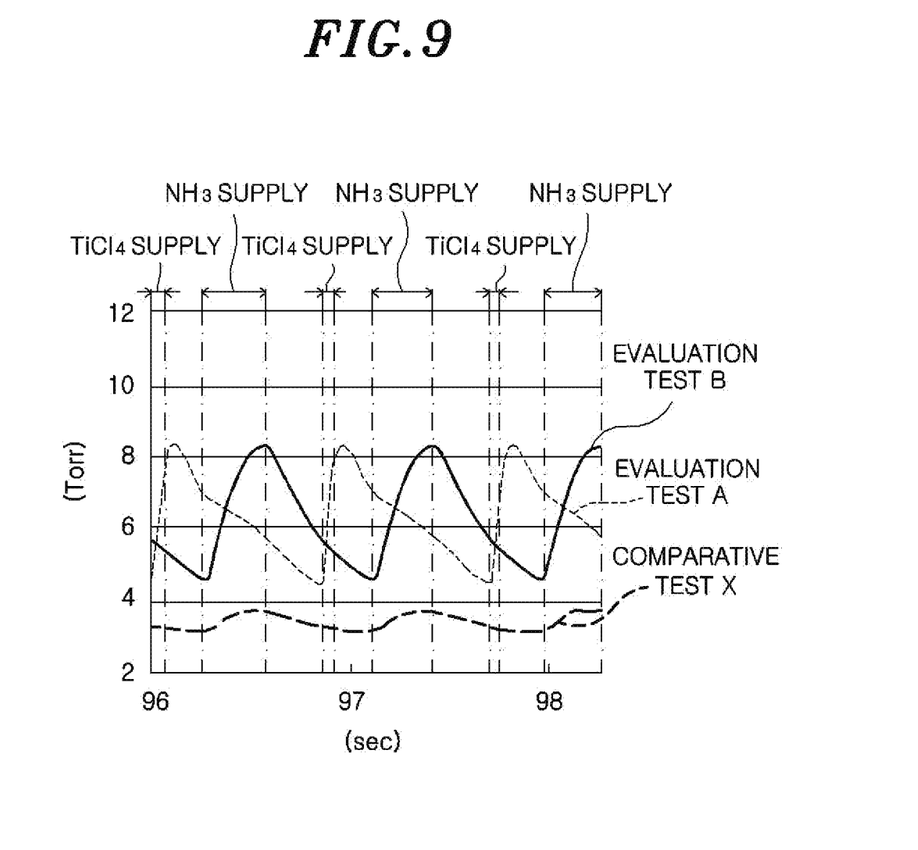
FIG. 9 shows results of the evaluation tests.

FIG. 9 is a graph showing periods of time in which $TiCl_4$ gas and $NH_3$ gas are supplied. Specifically, the results of the evaluation tests A and B and the comparative test X are superimposed in the graph showing a period of time in which a control signal for opening the valves V1 and V4 for $TiCl_4$ gas and $NH_3$ gas is applied. In FIG. 9, the horizontal axis represents elapsed time from the start of the supply of $N_2$ gas as a carrier gas and the vertical axis represents a pressure in the processing space 10 which was measured by a pressure gauge provided in the gas exhaust duct 17.

As shown in FIG. 9, in the comparative test X, a pressure in the processing space 10 during the supply period of $TiCl_4$ gas was about 3 Torr, which is low, and a pressure in the processing space 10 during the supply period of $NH_3$ gas was about 3.7 Torr, which is also low. In other words, in comparative test X, a partial pressure of the processing gas in the processing space 10 during the respective processing gas supply periods was low.

On the other hand, in the evaluation test A in which the ballast gas was supplied, the pressure in the processing space 10 during the supply period of $TiCl_4$ gas started to increase immediately after the start of supply and reached about 8 Torr. In the evaluation test B in which the ballast gas was supplied, the pressure in the processing space 10 during the supply period of $NH_3$ gas was gradually increased immediately after the start of supply, compared to that in the evaluation test A, and reached about 8 Torr as in the case of the evaluation test A. In other words, the partial pressure of the processing gas in the processing space 10 during the respective processing gas supply periods in the evaluation tests A and B can become higher than that that in the comparison test X by twice or more.

Therefore, it is clear that even when the supply amount of the processing gas is the same as that in the comparison test X, the partial pressure of the processing gas in the processing space 10 during the supply period of each processing gas can be quickly increased by supplying the ballast gas into the gas exhaust line 34 at the time of supplying the processing gas as in the evaluation tests A. and B.

Test Examples

In test examples 1 to 3, a TiN film was formed by using the above-described film forming apparatus 1. In the test examples 1 and 2, the gas channel 80 for the ballast gas was connected to the downstream side of the APC 36 in the gas exhaust line 34 and a film was formed. In the test example 3, the gas channel 80 for the ballast gas was connected to the upstream side of the APC 36 in the gas exhaust line 34 and a film was formed. In the test examples 1 and 3, the ballast gas was supplied into the gas exhaust line 34 only during the supply period of $NH_3$ gas between the supply period of $TiCl_4$ gas and the supply period of $NH_3$ gas. In the test example 2, the ballast gas was supplied into the gas exhaust line 34 only during the supply period of $TiCl_4$ gas.

In a comparative example, the TiN film was formed by using the above-described film forming apparatus 1 without supplying the ballast gas in any of the processing gas supply periods.

In the text examples 1 to 3 and the comparative example, $N_2$ gas as a carrier gas was constantly supplied at a flow rate of 1000 sccm. In the test examples 1 to 3 and the comparative example, a source gas supply step of supplying $TiCl_4$ gas at a flow rate of 150 sccm for 0.05 second, a step of supplying $N_2$ gas as a purge gas at a flow rate of 8000 sccm for 0.20 second and purging $TiCl_4$ gas, a reactant gas supply step of supplying $NH_3$ gas at a flow rate of 6000 sccm for 0.30 second, and a step of supplying $N_2$ gas as a purge gas at a flow rate of 8000 sccm for 0.30 second and purging $NH_3$ gas were repeatedly performed 300 times.

In the test examples 1 and 3, the ballast gas was supplied at a flow rate of 10000 sccm for 0.30 second while supplying the reactant gas during the reactant gas supply step. In the test example 2, the ballast gas was supplied at a flow rate of 10000 sccm for 0.05 second while supplying the source gas during the source gas supply step.

Figure 10:
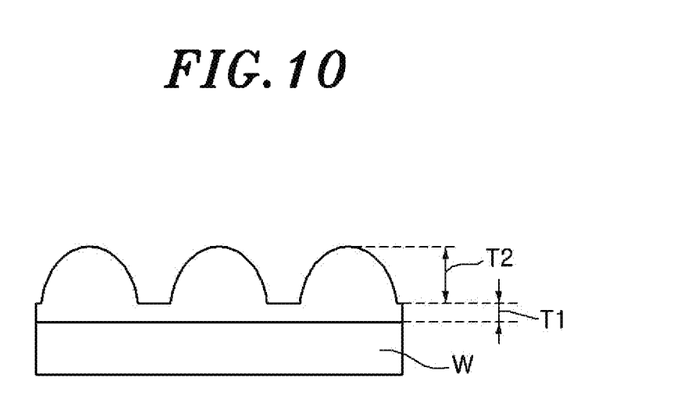
FIG. 10 explains a method for calculating a roughness layer ratio.

In the test examples 1 to 3 and the comparative example, a thickness T1 of a flat bulk portion and a thickness T2 of an uneven portion of the formed TiN film shown in FIG. 10 were measured at multiple locations by using an ellipsometer. A roughness layer ratio R was calculated based on the film thicknesses T1 and T2 measured at each of the locations. The roughness layer ratio R is given by R=T2/(T1+T2).

In the test examples 1 and 2 and the comparative example, distribution in a depth direction of a ratio (Cl/Ti) of chlorine (Cl) to titanium (Ti) was measured, as concentration distribution in a depth direction of the residual chlorine of the formed TiN film, by using XPS (X-ray Photoelectron Spectroscopy) and XRF (X-ray Fluorescence).

Figure 11:
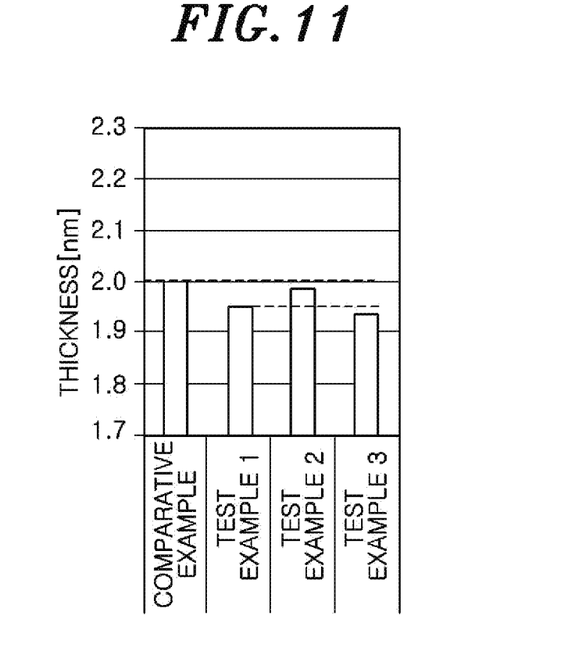
FIG. 11 shows film thicknesses at positions where the roughness layer ratio in test examples and a comparative example are minimum.

FIG. 11 is a graph showing film thicknesses at positions where the roughness layer ratio R of the test examples 1 to 3 and the comparative example are minimum.

As shown in FIG. 11, the film thickness at the position where the roughness layer ratio R is minimum is smaller in the test examples 1 and 2 than in the comparative example. From this, it is clear that a thin film with good continuity can be formed by supplying the ballast gas into the gas exhaust line 34 at the time of supplying the processing gas to the processing space 10.

Further, the film thickness at the position where the roughness layer ratio R is minimum is smaller in the test example 1 than in the test example 2. From this, it is clear that it is more preferable to supply the ballast gas into the gas exhaust line 34 at the time of supplying $NH_3$ gas than at the time of supplying $TiCl_4$ gas in order to form a thin film with good continuity.

Further, the film thickness at the position where the roughness layer ratio R is minimum is smaller in the test example 3 than in the test example 1. From this, it is clear that it is more preferable to introduce the ballast gas to the upstream side of the APC 36 in the gas exhaust line 34 than to the downstream side of the APC 36 in the gas exhaust line 34 in order to form a thin film with good continuity.

Figure 12:
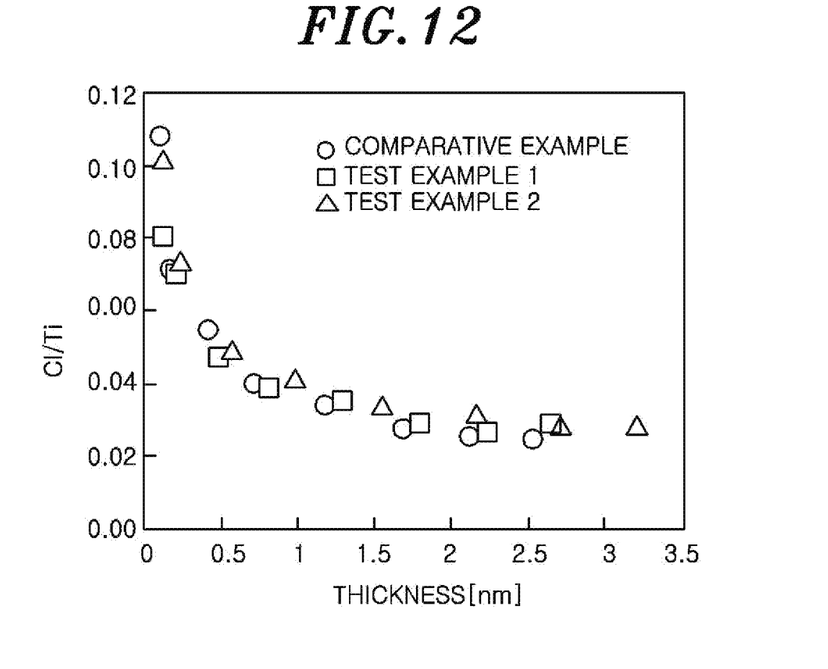
FIG. 12 shows concentration distribution in a depth direction of residual chlorine in TiN films in the test examples and the comparative example.

FIG. 12 is a graph showing distribution in a depth direction of the ratio of chlorine to titanium in TiN films in the test examples 1 and 2 and the comparative example. In FIG. 12, the horizontal axis represents a depth from a TiN film surface, and the vertical axis shows the above ratio.

The ratio of chlorine to titanium near a surface of the TiN film between the surface and a depth of 0.5 nm, i.e., a residual chlorine concentration near the surface, is lower in the test examples 1 and 2 than in the comparative example. From this, it is clear that the residual chlorine concentration near the film surface can be decreased, i.e., a high-quality TiN film having a low resistivity can be formed, by supplying the ballast gas into the gas exhaust line 34 at the time of supplying the processing gas to the processing space 10. The resistivity near the film surface is important when the TiN film is used for a semiconductor wafer.

While embodiments have been described with reference to the accompanying drawings, the present disclosure is not limited to those examples. It is obvious to those skilled in the art that various changes or modifications can be made within the scope of the claims and such changes or modifications fall within the technical scope of the present disclosure. The present disclosure is not limited to those examples and may employ various forms. For example, the present disclosure not limited to the case of forming a TiN film and may also be used for forming a WN (tungsten nitride) film, for example. In this case, tungsten chloride gas is used as a source gas, and $NH_3$ gas is used as a reactant gas, for example. In forming the TiN film or the WN film, a gas for nitriding the source gas is not limited to $NH_3$ gas and may be a gas containing nitrogen, e.g., hydrazine or the like.

The above embodiments can be applied to processes e.g., an etching process, other than the film forming process.

While the present disclosure has been shown and described with respect to the embodiments, it will be understood by those skilled in the art that various changes and modifications may be made without departing from the scope of the present disclosure as defined in the following claims.

What is claimed is:

1. A substrate processing method for processing a substrate by alternately performing a processing gas supply step of supplying a processing gas for processing the substrate into a processing chamber which accommodates the substrate and to which a gas exhaust line is connected and a replacement gas supply step of supplying a replacement gas for replacing an atmosphere in the processing chamber into the processing chamber multiple times, the method comprising:
  a ballast gas introducing step of introducing a ballast gas into the gas exhaust line when performing the processing gas supply step,
  wherein the substrate is processed by ALD,
  the processing gas supply step in which a metal-containing gas is used as the processing gas, the replacement gas supply step, the processing gas supply step in which a reduction gas is used as the processing gas and the replacement gas supply step are performed in that order multiple times, and
  the ballast gas introducing step is performed only when the processing gas supply step in which the reduction gas is used as the processing gas is performed.

2. The substrate processing method of claim 1, wherein in the ballast gas introducing step, the ballast gas is introduced to an upstream side of an opening degree variable valve provided in the gas exhaust line.

3. The substrate processing method of claim 1, wherein timing of introducing the ballast gas in the ballast gas introducing step is later than timing of opening a valve provided between a supply source of the processing gas and the processing chamber.

* * * * *